(12) United States Patent
Skerlj et al.

(10) Patent No.: US 7,844,785 B2
(45) Date of Patent: Nov. 30, 2010

(54) METHOD AND APPARATUS FOR MEMORY ACCESS OPTIMIZATION

(75) Inventors: Maurizio Skerlj, Munich (DE); Paolo Ienne Lopez, Lausanne (CH)

(73) Assignee: Qimonda AG, Munich (DE)

( * ) Notice: Subject to any disclaimer, the term of this patent is extended or adjusted under 35 U.S.C. 154(b) by 531 days.

(21) Appl. No.: 11/876,212

(22) Filed: Oct. 22, 2007

(65) Prior Publication Data
US 2009/0106506 A1 Apr. 23, 2009

(51) Int. Cl.
*G06F 12/00* (2006.01)
(52) U.S. Cl. ...................................................... 711/154
(58) Field of Classification Search .................. None
See application file for complete search history.

(56) References Cited

U.S. PATENT DOCUMENTS 7,085,909 B2 * 8/2006 Ananthanarayanan et al. ... 711/202

OTHER PUBLICATIONS

Carter, J., et al., "Impulse: Building a Smarter Memory Controller," 1999, 10 pages, University of Utah Department of Computer Science.
Kim, D., et al., "Architectural Support for Uniprocessor and Multiprocessor Active Memory Systems," IEEE Transactions on Computers, Mar. 2004, pp. 288-307, vol. 53, No. 3, IEEE Computer Society.
McKee, S.A., et al., "Design and Evaluation of Dynamic Access Ordering Hardware," Proceedings of the 10th International Conference on Supercomputing, May 25-28, 1996, pp. 2-8, Philadelphia, PA.
Rau, B.R., "Pseudo-randomly interleaved memory," publication information, if any; unknown.
Rau, B.R., "Pseudo-randomly interleaved memory," Proceedings of the 18th annual international symposium on Computer architecture, May 1991, pp. 74-83, vol. 19, Issue 3, ACM, New York,NY.
Rixner, S., et al., "Memory Access Scheduling," Proceedings of the 27th International Symposium on Computer Architecture, 2000, pp. 128-138,IEEE.
Zhang, C., et al., "Hardware-Only Stream Prefetching and Dynamic Access Ordering," Proceedings of the 14th International Conference on Supercomputing, 2000, pp. 167-175, ACM, New York, NY.
Zhang, Z., et al., "A Permutation-based Page Interleaving Scheme to Reduce Row-buffer Conflicts and Exploit Data Locality," Proceedings of the 33rd annual ACM/IEEE International Symposium on Microarchitecture, 2000, pp. 32-41, ACM, New York, NY.

* cited by examiner

*Primary Examiner*—Brian R Peugh
(74) *Attorney, Agent, or Firm*—Slater & Matsil, L.L.P.

(57) ABSTRACT

Access to a memory is optimized by monitoring physical memory addresses and by detecting a memory access conflict based on the monitored physical memory addresses. The data stored at a physical address for which a conflict was detected is transferred to a new physical address.

20 Claims, 4 Drawing Sheets

METHOD AND APPARATUS FOR MEMORY ACCESS OPTIMIZATION

TECHNICAL FIELD

Embodiments of the present invention relate to a method and an apparatus for optimized memory access, in particular to a concept allowing to avoid memory access conflicts and, thus, to increase the overall performance of a memory system.

BACKGROUND

A conventional DRAM is organized in a matrix-structure having a predetermined number of rows and columns per memory bank. By selecting a row (providing a row-address) the memory elements of all columns associated to the selected row are readable, as all memory elements (capacitors) associated to the row are connected to the data lines (columns).

In order to allow for a reliable readout, the data-lines (column-lines) have to be precharged prior to the connection of the storage capacitors to the column-lines. Precharging is performed by applying a predetermined voltage which is chosen between the high- and the low-voltage of the system to each individual column-line. Even when the voltage source is disconnected from the column-lines, the voltage is maintained for a certain amount of time, due to the capacitance of the column-lines. It is only possible to reliably sense the small voltage variations caused by the charge stored on the individual storage capacitors, when the column-lines had been precharged. However, precharging takes a certain amount of time, which is called row-precharge time $t_{RP}$, and which is usually expressed in terms of clock cycles. Once the signal on the column lines has stabilized, a specific column may be chosen by a column address. After the column address and the associated sense amplifiers on the column (word)-lines have stabilized, data is provided at the output of the memory element. Often, more than one single bit is provided as a result of a read-request (a single read-command). Then, the transmission of data (the so-called burst length) might take longer than one single clock single.

Memory arrays are furthermore organized in larger entities, so-called banks, which can be selected individually by a memory controller. That is, different banks exist, each bank having associated rows and columns of memory elements. As an even larger entity, ranks might exist, each rank having a plurality of memory banks, and each memory bank having a plurality of rows.

That is, to physically access a specific memory element, a rank has to be chosen, a bank within the rank has to be selected and within the bank, the desired row and column has to be accessed.

Access time of modern DRAMs depend on previous accesses and, in particular, on the location of the memory cells within the physical memory-arrangement of the DRAMs as it is illustrated in FIG. 1.

FIG. 1 shows three different scenarios a), b) and c) of two consecutive memory read operations with significantly differing response times, i.e., with completely different times that elapse from the first memory read request until the delivery of the data of the following read request.

FIG. 1a illustrates the best-case scenario, in which two consecutive memory accesses are performed to the same row of the same bank of a memory module. FIG. 1b illustrates the worst-case, where consecutive memory accessed are scheduled to different rows of the same memory-bank. FIG. 1c shows a scenario, where consecutive memory accesses are performed to different banks of a memory module.

The selection of the different ranks, banks and rows/columns is performed by an associated memory controller. The example in FIG. 1 does, for the sake of simplicity, assume that there exists only one rank, such that only bank select signals will be discussed in the following paragraphs.

FIG. 1a illustrates the access-timing of two consecutive memory accesses to different columns of the same row of the same bank. In the timing diagrams subsequently discussed, the first row 2 schematically illustrates the clock signal. On occurrence of the clock signal 2, the commands or data provided at a command line 4 and an address line 6 are evaluated and the corresponding operation is performed. The provision of data read out at the data lines 8 is also synchronized with the clock signal, as it is common practice. The commands or operations performed by a memory controller when accessing the memory are indicated in the command line 4, whereas the address line 6 illustrates the addresses (bank, row and column addresses) that are intended to be accessed. The data row 8 does schematically sketch the data provided and the latency, i.e., the time elapsed after the issue of the read command until the first data bit is provided by the memory.

When consecutively accessing two different columns within the same row of the same bank, a continuous data stream of two data bursts can be retrieved after an unavoidable read latency occurring after the first read command. In particular, the memory bank comprising the memory element to be accessed has to be activated first. For that purpose, the bank address and the row address are provided at the address lines 6 in step 10a, simultaneously to an activate command, which is send on the command line 4, indicating that the corresponding bank shall be used and activated.

It may be noted that, for the ease of understanding, the times which are required for the stabilization of the address signals and of the read-out signals at the column lines are subsequently omitted to focus only on those timings that can be improved by accessing different memory elements. This is fully justified as inherent electrical properties of the bit lines, i.e., the capacitants and so on, cannot be influenced by different access schedules, which shall be discussed here. Therefore, the timing diagram of FIG. 1a is based on the assumption that the row of the associated bank is selected and that the signals of the associated memory elements are available at the column lines one clock cycle after the activation command.

In the following clock cycle 10b, the column address can be provided at the address lines together with the bank address, whereas the command line indicates that a read operation is to be performed (a read request). After the read request, the so-called "read latency" is required until the data burst is available at the data lines of the memory module, which is the case at clock cycle 12 in the given example. With the end of the data burst at clock cycle 14, the first read operation is finished.

As the second, consecutive memory access is performed to a different column in the same row of the same bank, the next column address to be read out can be provided on address line 16 without selecting a different bank. However, the next read operation can only be requested after the expiration of the burst length 18, which is considered by the memory controller. After the burst length 18, the next column address 16 is issued together with a read command and, as no further latencies have to be considered, the requested burst of data will be provided right after the first data burst of the first read request 10b.

FIG. 1b illustrates the timing, when consecutive memory accesses are performed to the same memory bank, but to different rows within the bank. As the command sequence for the first memory access equals the command sequence of the previously described memory access, a repeated description of the first two steps 10a and 10b will be omitted.

Generally, identical or like elements or steps will be assigned the same reference numerals throughout the application and a repeated description of those elements will be omitted.

As the second memory access accesses a different row of the same memory bank, the second read command cannot be issued as quickly as in FIG. 1a. Instead, all columns of the respective bank have to be precharged before the next row-selection can be performed. That is, a precharge command has to be issued at step 20 to trigger a precharge of the column-lines of the associated memory banks. There is a certain minimum time (row access strobe) that has to be waited after an activate command to the following precharge command. Therefore, an additional latency ($t_{RAS}$) occurs, when two rows of memory shall be consecutively accessed within the same memory bank.

Furthermore, precharging itself requires a certain, even larger, amount of time ($t_{RP}$), the row-precharge time 24. That is, the next activate signal can only be issued in step 26, which can then be followed by the second read request 28. The second read request can therefore only be issued after the first read request when the latencies of $t_{RAS}$ 22 and $t_{RP}$ 24 (the so-called "row cycle" time $t_{RC}$) are elapsed. That is, in other words, once two consecutive memory accesses access the same row within the same memory bank of a DRAM, large additional, undesirable latencies have to be accepted, which significantly decrease the memory performance and the overall memory bandwidth.

FIG. 1c illustrates the timing when accessing different rows of different banks. Therefore, in a step 30, which follows step 10b of the previous read request, the new bank address and the associated row address can be provided at the address lines and the corresponding activate command can be sent. After the activation of the new bank ($Bk_K$), the second read request can be directly issued, associated by the column address of the column to be read out. The first burst of data is received after the read latency, as in the previous cases. However, the second burst of data 34 from the second memory bank is received after only a short delay time, as illustrated in FIG. 1c.

As the previously described examples have shown, consecutive memory accesses may be performed to memory locations which deliver the requested data with a low latency or to memory locations which deliver the data with a high latency. In the most general terms, consecutive memory access to memory locations which are physically interrelated in an unfortunate way (resulting in high access times), are called memory conflicts.

The avoidance of memory conflicts may, therefore, increase the overall performance of the memory subsystem and the memory bandwidth.

BRIEF DESCRIPTION OF THE DRAWINGS

In the following paragraphs, several embodiments of the present invention will be described, referencing the enclosed figures, wherein.

DETAILED DESCRIPTION OF ILLUSTRATIVE EMBODIMENTS

Figure 1:
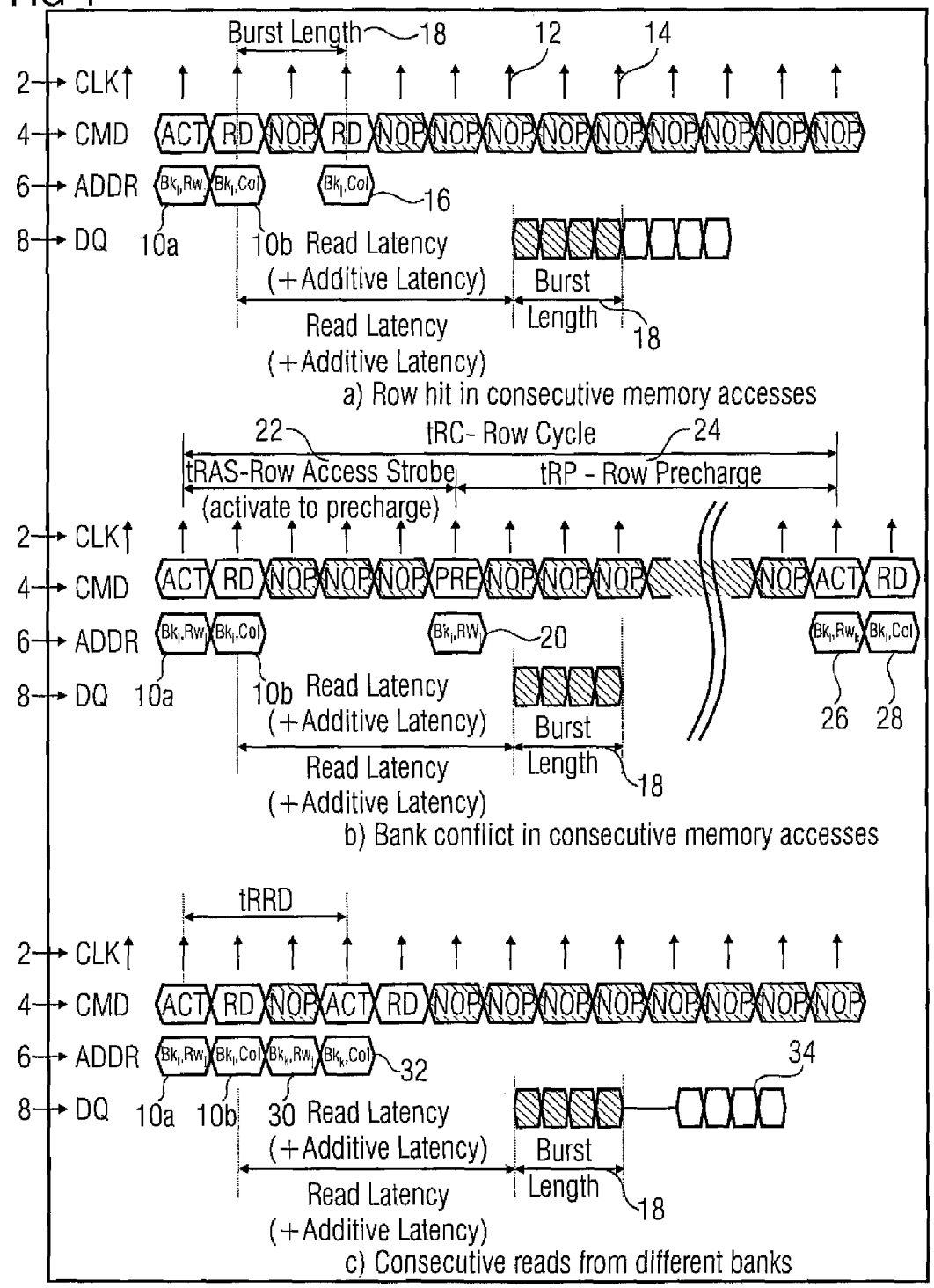
FIGS. 1a-1c, shown collectively as FIG. 1, show access times for a DRAM under various scenarios.

Throughout the following description, identical or like elements or steps will be assigned the same reference numerals and a repeated description of those elements will be omitted.

Embodiments of the present invention are, as an example of a possible application, detailed for memory accesses to conventional DRAMs. Other memory devices, such as non-conventional DRAMs and other types of memories, can also use concepts of the invention.

Figure 2:
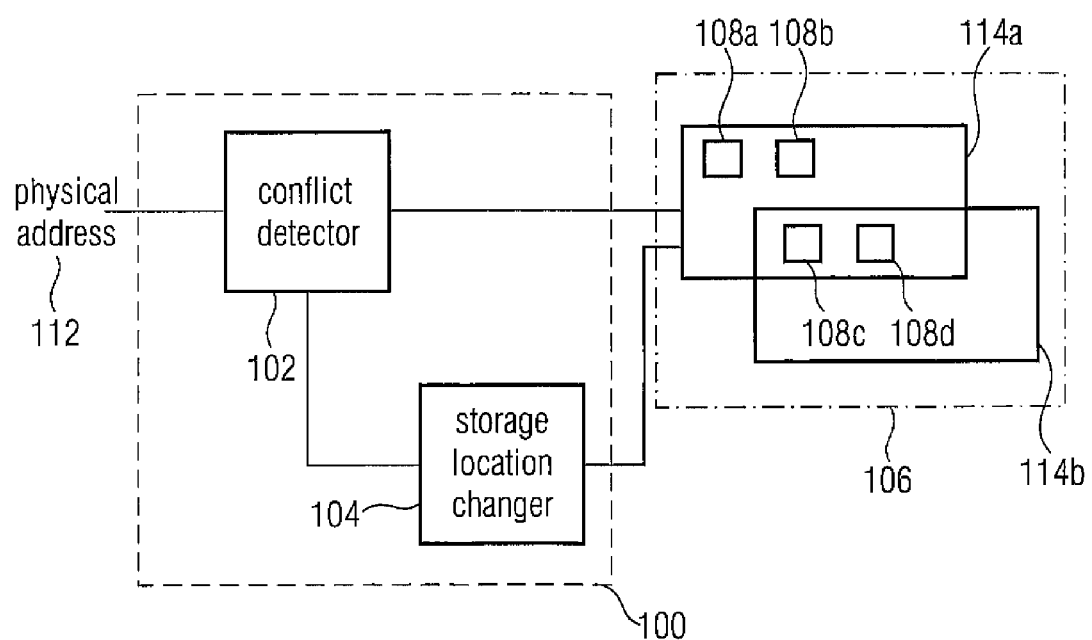
FIG. 2 shows an embodiment of the present invention.

FIG. 2 shows an embodiment of a memory access optimizer 100 which comprises a conflict detector 102 and a storage location changer 104. The conflict detector 102 as well as the storage location changer 104 are connected to a memory array 106, which stores data at locations 108a-108d which are addressable by physical memory addresses. Each of the locations 108a-108d may comprise one or more memory elements. Each memory element may comprise one or more memory cells.

The conflict detector 102 is configured to monitor physical memory addresses used to access the memory 106. The conflict detector 102 may furthermore be configured to detect a memory access conflict based on the monitored memory addresses 112.

The storage location changer 104 is configured to transfer data stored at a physical address for which a conflict is detected to a new physical address.

When, for example, a memory access conflict is detected for the memory location 108a, the storage location changer 104 would transfer the data stored in memory location 108a to, e.g., memory location 108c. As indicated in FIG. 2, the memory 106 may comprise two separately accessible memory portions 114a and 114b, wherein each memory portion has a plurality of memory locations, i.e. memory locations 108a and 108b belonging to the memory portion 114a and memory locations 108c and 108d belonging to the memory portion 114b.

According to a different embodiment, the storage location changer may be configured to transfer the data of a memory location of one memory portion to a memory location of a different memory portion, once a memory conflict has been detected. That is, for example, when conflict detector 102 detects a memory conflict for memory location 108a, the storage location changer 104 would, for example, transfer the data stored in memory location 108a to one of the memory locations 108c or 108d of memory portion 114b. Such, increased read access times may be avoided in following memory accesses, when the same data sequence is accessed a second time. Increased access times may be avoided by transferring the data from one memory portion to a different memory portion in conventional memory systems, in which memory areas are organized in independently accessible memory portions, as it is, for example, the case with DRAM.

When, in embodiments of the invention, memory organized in banks and ranks is used, once a memory conflict is detected, the storage location changer might be configured to transfer data from one memory bank to a different memory bank within the same rank or from one memory bank to an arbitrary memory bank of a different memory rank, to avoid the high latency memory accesses indicated in FIG. 1b.

The conflict detector 102 may detect a memory conflict by monitoring the physical memory addresses and the access scheme of the memory accesses. By maintaining an access history, memory conflicts may be detected, for example by detecting the command sequence activate-precharge-activate for each and the same memory bank. However, it goes without saying that the conflict detector may detect the occurrence of a memory conflict using other criteria, such as for example other command cycles or the delay time between the subsequent occurrence of different data bursts at the memory bus. If, for example, two consecutive read requests result in data bursts separated by a long delay time, the conflict detector might conclude, that a memory conflict has occurred.

It may be noted that, as memory technology evolves, the spread between subsequent accesses with memory conflict and without memory conflict has decreased dramatically, as the following table proves.

TABLE 1

DRAMs access scheduling distances evolution

| DRAM Generation | Scheduling distance [ns] | | Spread [%] |
| --- | --- | --- | --- |
| | Best Case (BL 8 UI) | Worst Case tRC | |
| SDRAM-PC 133 3-3-3 | 60 | 67 | 11.4 |
| DDR-333-3-3-3 | 24 | 60 | 150 |
| DDR2-800 4-4-4 | 10 | 55 | 450 |
| DDR3-1600 8-8-8 | 5 | 45 | 800 |

The first column of the table shows different DRAM generations in the order of their appearance. As it can be seen, the difference between a best-access scenario (FIG. 1a) and a worst-access scenario (FIG. 1b) was only 11.4% for ancient PC 133-ram. Whereas the row cycle time $T_{RC}$ has not been improved dramatically, the best case access times have become dramatically better, mainly because of the use of double data rate techniques using prefetch-buffers to consecutively transfer 2, 4 or 8 data words per read request. In other words, the gain in memory bandwidth would become more and more significant for newer memory technologies, when the occurrence of memory conflicts can be avoided.

The embodiment discussed in FIG. 2 may allow the detection of memory conflicts at run-time of a program. A conflict occurs when a memory access must be delayed because of a previous access. As an example, each time two rows belonging to the same bank must be accessed concurrently or consecutively, the bank must be first precharged and then reactivated (as depicted in FIG. 1b). The additional scheduling delays for different DRAM generations are reported in the previous table. Such conflicts might be characterized by an activate-precharge-activate pattern in the memory command vectors, with a scheduling delay between the two activate commands equal to the row cycle time ($t_{RC}$) or slightly greater (accounting for the fact that extra clock cycles between the two activate commands can be inserted in order to resolve contentions on the data or command bus). The likelihood of future occurrences of a conflict in memory accesses increases with the number and frequency of past occurrences of the same conflict. Therefore, the address of the memory blocks to be reallocated may be determined by keeping track of a conflict history. As an implementation example, this may be achieved by storing the number of times that a row conflicted with a different row belonging to the same bank.

The decision of reallocating a row can, for example, be taken when one of the counters exceeds a predetermined threshold value. The reallocation can be performed by moving the row content to a row belonging to a different memory bank or to a bank belonging to a different rank.

In order to eliminate the source of a conflict, a row may be reallocated to a physically different row. Each reallocation may comprise reading out the entire row and writing it back to a different location. The history of the reallocation may be kept in order to guarantee a consistent addressing of the memory space. It might also be appropriate to keep track of free and freed memory allocations.

Figure 3:
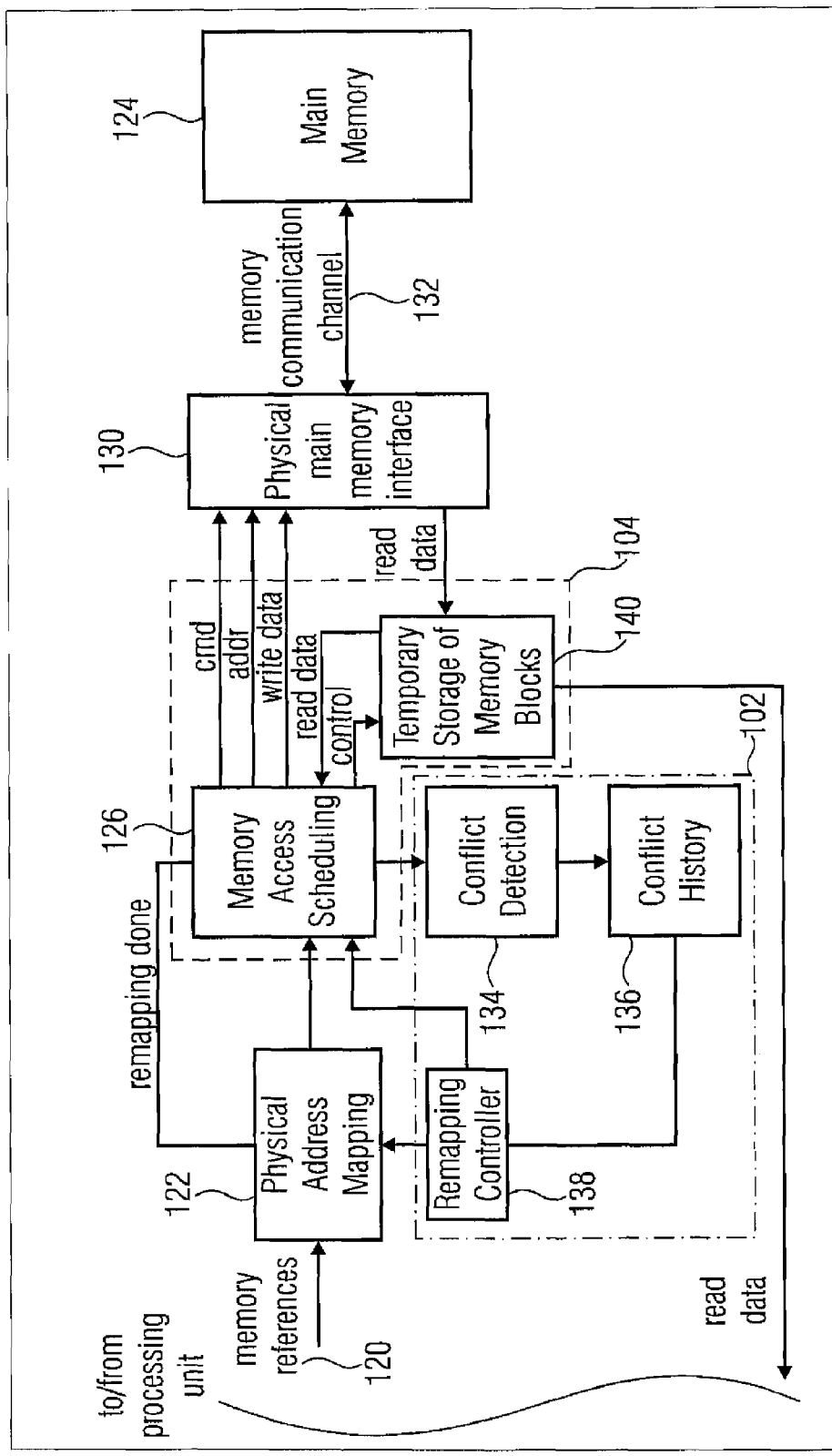
FIG. 3 shows a further embodiment of the present invention.

FIG. 3 illustrates a further embodiment of a memory access optimizer comprising a conflict detector 102 and a storage location changer 104. Memory addresses contained in memory references 120 are provided to the memory access optimizer 118 and, in particular, to an address translator 122, which translates the received addresses to physical addresses corresponding to memory locations of an associated memory 124. The physical memory addresses are forwarded to an access scheduler 126, which schedules the memory accesses and translates the instructions to a specific memory protocol used in order to satisfy the main memory timing requirements and the overall functionality of the main memory 124. The access scheduler 126 does, for example, create the activate and precharge commands, discussed in FIG. 1. Of course, further commands may be created and issued by the access scheduler, such as refresh commands, which are used to refresh the RAM-content in DRAM modules. In order to communicate with the main memory 124, the access scheduler 126 may provide command, address and write data to a physical interface 130, which communicates with the main memory 124 using, for example, a physical bus 132. The physical interface 130 could, for example, be a driving circuit, used to drive the currents on a connected data bus. The access scheduler 126 does also communicate the relevant information, i.e., for example, physical memory address data, to a conflict detection circuit 134, which is part of the conflict detector 102 and which is configured to detect a memory access conflict by evaluating the monitored memory address data.

In the particular embodiment of FIG. 3, the conflict detection circuit 134 reports the occurrence of a or each conflict to a conflict history element 136, which keeps track of a conflict history, i.e. of the memory conflicts occurred in the past. A remapping controller is connected to conflict history element 136 and decides, based on the stored conflict history, which memory block is to be reallocated and where it is to be stored to. This could, for example, be the case when a predetermined number of memory conflicts have been detected for a particular memory block or memory row.

The remapping controller 138 communicates the remapping decision together with the relevant remapping information, i.e., which memory location is to be transferred and to which target location it shall be transferred, to both the address translator 122 and the access scheduler 126. The communication of the new physical memory address to the address translator enables the address translator 122 to update its address translation tables, such as to reference the correct physical address, when the associated data is to be accessed the next time.

As the transfer of data stored at a physical address is basically a read and a consecutive write operation of the associated data, the access scheduler may generate the commands relevant to the physical reallocation of the memory block. During the reallocation, the memory system should remain self-consistent, i.e., the access scheduler 126, should furthermore manage the references to the data to be transferred until the memory blocks (rows) in process of being reallocated are finally transferred to the new physical address. This could be performed by either delaying the requests until the reallocation is complete or by using a local copy of the memory block to be reallocated, which could, for example, be stored in a temporary storage memory 140, which is accessible by the access scheduler 126. The local memory 140 may also be used to efficiently swap the physical location of the memory blocks. That is, the local memory 140 may serve as cache memory in which the data to be reallocated is stored, until it is finally written to its new destination.

Once the reallocation or the transfer of data is complete, the access scheduler 126 indicates the completion of the transfer to the address translator 122, which may then update its internal data base. From the indication of completeness, the memory translator 122 uses an updated allocation scheme when translating the received addresses 120 to the physical addresses.

Utilizing the previously discussed embodiment, memory accesses may be optimized during run-time, i.e., the remapping may automatically adapt to the system requirements. This would automatically increase memory bandwidth and, therefore, system performance.

This can be achieved while, at the same time, assuring a self-consistency of the memory. That is, even during the reallocation procedure, external memory requests are processed, without harming the system performance by incorporating wrong or miss-read data.

A memory access optimizer might, according to some embodiments, be integrated into a memory controller or into the central processing unit itself, where it can be utilized to avoid the occurrence of memory conflicts. It could also be integrated in a processing buffer embedded within main memory systems, such that no modifications of CPUs or memory controllers are required. An embodiment of a memory access optimizer may furthermore be integrated in devices that need to detect conflicts in the memory references, that may incorporate algorithms for deciding which memory blocks need to be reallocated, that perform the allocation or that decide on the target destination and the temporary storage area for memory blocks to be reallocated.

This could, for example, also be a memory controller built on a flash-memory-device or the like. Furthermore, the memory access optimizers may be integrated into systems, in which sequential memory accesses are unlikely, such as in multi-threaded or multi-CPU-systems, where the memory usage schedule is unpredictable.

Figure 4:
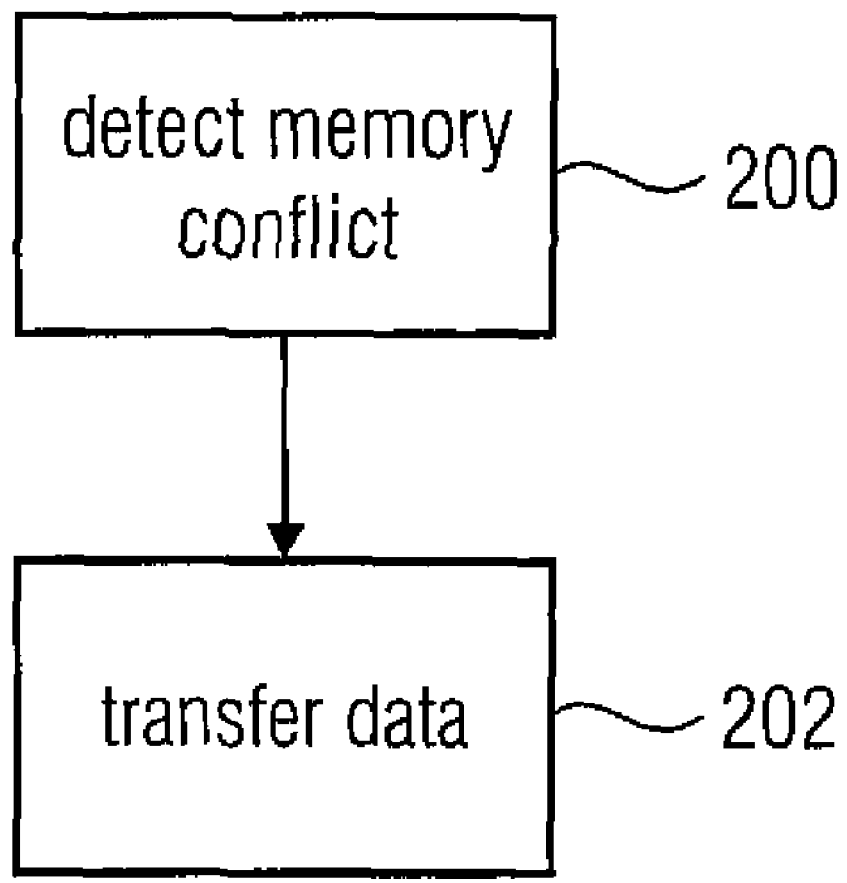
FIG. 4 shows an embodiment of an inventive method.

In the embodiment of FIG. 4, physical memory addresses are monitored and, based on the monitored memory addresses, a memory access conflict is detected in a detection step 200.

Once a memory access conflict is detected, data stored at the physical address for which the conflict is detected is transferred to a new physical address in a transfer step 202.

While the monitoring of the physical memory addresses is performed permanently when the devices incorporating embodiments of the inventive method are operative, memory conflicts can be suppressed by permanently redistributing data within the physical memory.

FIG. 4 thus shows an embodiment of a method for memory access optimization which is capable of optimizing memory access (i.e., avoiding memory conflicts) at run-time of a program. That is, the embodiment may be effective to avoid memory conflicts without any a priori knowledge on the running processes or the programs running on a system and their memory allocation algorithms.

Furthermore, the application of embodiments of methods or embodiments of access optimizers may be completely independent from the operating system, which normally performs virtual to physical address translation. Therefore, embodiments may be used in any environment. This may, for example, include also mobile devices, such as PDAs, mobile phones, mobile navigation systems and the like.

Although most embodiments have previously been discussed for accessing DRAMs, the application of the embodiments is by no means restricted to DRAMs. To the contrary, all other type of storage media, better to say, the access to all other types of storage media, may be performed using further embodiments. That could, for example, be flash-media, SRAMS or other rewritable media types. For example, some embodiments may also be used to access hard-disk systems, where the data may be transferred such that a movement of the read/write head of the hard disk can be minimized for subsequent read accesses. The same technique could also be applied to UDF formatted optical storage media, used to temporarily store data within in a PC system or the like.

Generally, whenever data is to be read from a storage medium having physically separated storage areas, embodiments may be used for read and write operations to that particular storage media.

Depending on certain implementation requirements, further embodiments of access methods can be implemented in hardware or in software. The implementation can be performed using a digital storage medium, in particular a disk, DVD or a CD having electronically readable control signals stored thereon, which cooperate with a programmable computer system such that embodiments of the methods are performed. Generally, some embodiments can, therefore, be a computer program product with a program code stored on a machine readable carrier, the program code being operative for performing the embodiments of access methods when the computer program product runs on a computer. In other words, some embodiments are, therefore, a computer program having a program code for performing at least one of the methods when the computer program runs on a computer.

While the foregoing has been particularly shown and described with reference to particular embodiments thereof, it will be understood by those skilled in the art that various other changes in the form and details may be made without departing from the spirit and scope thereof. It is to be understood that various changes may be made in adapting to different embodiments without departing from the broader concepts disclosed herein and comprehended by the claims that follow.

What is claimed is:

1. A memory access optimizer, comprising:
    a conflict detector configured to monitor physical memory addresses and to detect a memory access conflict based on the monitored physical memory addresses, wherein the memory access optimizer is configured to access a memory having a plurality of separately accessible memory portions comprising a plurality of memory elements, and wherein the conflict detector is configured to detect the conflict when two or more consecutive memory accesses are performed to different memory elements of the same memory portion; and
    a storage location changer configured to transfer data stored at a physical address for which a conflict is detected to a new physical address.

2. The memory access optimizer in accordance with claim 1, wherein the memory access optimizer is configured to access a memory having a plurality of memory banks, each memory bank having a plurality of rows of simultaneously selectable memory elements; and
    wherein the conflict detector is configured to detect a conflict when two consecutive memory accesses are performed to different rows of the same memory bank.

3. The memory access optimizer in accordance with claim 2, wherein the storage location changer is configured to transfer the data stored in a row of a first memory bank to a row of a second memory bank.

4. The memory access optimizer in accordance with claim 2, wherein the conflict detector is configured to detect a conflict when a command cycle comprising an activate, a precharge and an activate command is detected in two consecutive memory accesses for the same memory bank.

5. The memory access optimizer in accordance with claim 1, wherein the storage location changer is configured to transfer the data from a memory element of a first memory portion to a memory element of a second memory portion.

6. The memory access optimizer in accordance with claim 1, wherein the memory access optimizer is configured to access a memory with a plurality of ranks, each rank having a plurality of memory banks, each memory bank having a plurality of rows of simultaneously selectable memory elements, wherein
the storage location changer is configured to transfer the data from a row of a memory bank of a first rank to a row of an arbitrary memory bank of a second different rank.

7. The memory access optimizer in accordance with claim 1, wherein the storage location changer is configured to transfer the data after a conflict for a same physical address was determined a predetermined number of times.

8. The memory access optimizer in accordance with claim 1, wherein the storage location changer further comprises a buffer memory configured to temporarily store the data to be transferred.

9. The memory access optimizer in accordance with claim 1, further comprising an address translator configured to replace the physical address by the new physical address for physical addresses from which data was transferred.

10. The memory access optimizer in accordance with claim 9, further comprising:
a memory interface configured to physically access the memory using the physical address provided by the address translator.

11. The memory access optimizer in accordance with claim 9, wherein the address translator further comprises an input interface configured to receive memory addresses to be accessed.

12. The memory access optimizer in accordance with claim 1, wherein the conflict detector is configured to detect memory access conflicts associated to read operations.

13. The memory access optimizer in accordance with claim 1, wherein the memory access optimizer is adapted to optimize the memory access to a memory having a plurality of banks, each bank having a plurality of rows of simultaneously selectable memory elements, wherein:
the conflict detector is configured to detect a memory access conflict when consecutive memory accesses are performed to different rows within the same bank; and
the storage location changer is configured to transfer data stored in a row for which a conflict has been detected to a new row of a different bank.

14. A memory access optimizer, comprising:
a conflict detector configured to monitor physical memory addresses and to detect a memory access conflict based on the monitored physical memory addresses, wherein the memory access optimizer is configured to access a memory having a plurality of separately accessible memory portions comprising a plurality of memory elements, and wherein the conflict detector is configured to detect the conflict when two or more consecutive memory accesses are performed to different memory elements of the same memory portion;
a storage location changer configured to transfer data stored at a physical address for which a conflict is detected to a new physical address;
an address translator configured to receive memory addresses and to translate the received addresses to physical memory addresses, the address translator being further configured to replace the physical addresses by the new physical addresses for physical addresses from which data has been transferred by the storage location changer; and
a memory interface configured to physically access the memory using the physical address provided by the address translator.

15. A memory system, comprising:
a memory access optimizer, wherein the memory access optimizer is configured to access a memory having a plurality of separately accessible memory portions comprising a plurality of memory elements, the memory access optimizer comprising:
a conflict detector configured to monitor physical memory addresses and to detect a memory access conflict based on the monitored physical memory addresses and configured to detect the conflict when two or more consecutive memory accesses are performed to different memory elements of the same memory portion; and
a storage location changer configured to transfer data stored at a physical address for which a conflict is detected to a new physical address; and
a memory accessible using physical memory addresses, the memory comprising the physical address and the new physical address.

16. A method for optimizing a memory access, the method comprising:
monitoring physical memory addresses for detecting a memory access conflict based on the monitored memory addresses, wherein the memory comprises a plurality of separately accessible memory portions having a plurality of memory elements;
detecting a conflict when two consecutive memory accesses are performed to different memory elements of the same memory portion; and
transferring data stored at a physical address for which a conflict is detected to a new physical address.

17. The method in accordance with claim 16, wherein the data is transferred from a memory element of a first memory portion to a memory element of a second memory portion.

18. The method in accordance with claim 16, wherein the data is transferred after the same memory conflict has been detected for a predetermined number of times.

19. The method in accordance with claim 16, wherein the method is adapted to optimize the access to a memory having a plurality of banks, each bank having a plurality of rows of simultaneously selectable memory elements, wherein:
a memory access conflict is detected, when consecutive memory accesses are performed to different rows within the same memory bank; and
data stored in a row for which a conflict was detected is transferred to a row in a different bank.

20. An apparatus for optimizing memory access, the apparatus comprising:

means for accessing a memory having a plurality of separately accessible memory portions comprising a plurality of memory elements;

means for monitoring physical memory addresses;

means for detecting a memory access conflict based on the monitored physical memory addresses, wherein the means for detecting the memory access conflict detect a conflict when two or more consecutive memory accesses are performed to different memory elements of the same memory portion; and means for transferring data stored at a physical address for which a conflict was detected to a new physical address.

* * * * *